US006664808B2

(12) United States Patent
Ling et al.

(10) Patent No.: US 6,664,808 B2
(45) Date of Patent: Dec. 16, 2003

(54) METHOD OF USING PARTIALLY DEFECTIVE PROGRAMMABLE LOGIC DEVICES

(75) Inventors: Zhi-Min Ling, Cupertino, CA (US); Jae Cho, Sunnyvale, CA (US); Robert W. Wells, Cupertino, CA (US); Clay S. Johnson, San Jose, CA (US); Shelly G. Davis, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/924,365

(22) Filed: Aug. 7, 2001

(65) Prior Publication Data

US 2003/0062923 A1 Apr. 3, 2003

(51) Int. Cl.⁷ .............................................. H03K 19/177
(52) U.S. Cl. ............................... 326/41; 326/38; 326/10
(58) Field of Search .......................... 326/9, 10, 37–41; 716/4

(56) References Cited

U.S. PATENT DOCUMENTS

| | | | |
|---|---|---|---|
| 3,995,261 A | | 11/1976 | Goldberg |
| 4,020,469 A | | 4/1977 | Manning |
| 4,700,187 A | | 10/1987 | Furtek |
| 4,899,067 A | * | 2/1990 | So et al. ........................ 326/13 |
| 5,459,342 A | | 10/1995 | Nogami et al. |
| 5,485,102 A | * | 1/1996 | Cliff et al. ...................... 326/10 |
| 5,498,975 A | | 3/1996 | Cliff et al. |
| 5,592,102 A | * | 1/1997 | Lane et al. ..................... 326/10 |
| 5,777,887 A | | 7/1998 | Marple et al. |
| 5,889,413 A | | 3/1999 | Bauer |
| 5,914,616 A | | 6/1999 | Young et al. |
| 6,166,559 A | * | 12/2000 | McClintock et al. ......... 326/10 |
| 6,167,558 A | | 12/2000 | Trimberger |
| 6,344,755 B1 | * | 2/2002 | Reddy et al. .................. 326/10 |
| 6,356,514 B1 | | 3/2002 | Wells et al. |

OTHER PUBLICATIONS

John Emmert et al.; "Dynamic Fault Tolerance in FPGAs via Partial Reconfiguration"; Annual IEEE Symposium on Field–Programmable Custom Computing Machines; Apr. 17, 2000; pp. 165–174.

John M. Emmert et al.; "Incremental Routing in FPGAs"; ASIC Conference 1998. Proceedings, Eleventh Annual IEEE International; Rochester, NY; Sep. 13–16, 1998; pp. 217–221.

* cited by examiner

Primary Examiner—Don Le
(74) Attorney, Agent, or Firm—H. C. Chan; Kim Kanzaki

(57) ABSTRACT

FPGAs that contain at least one localized defect may be used to implement some designs if the localized defect is not used in the designs. To determine if the FPGA is suitable to implement a design, the design is loaded into the FPGA. The FPGA is tested to determine whether it can execute the design accurately even with the localized defect. The FPGA will be marked as suitable for that design if it passes the test. If the FPGA is found to be unsuitable for one design, additional designs may be tested. Thus, a FPGA manufacturer can sell FPGAs that are normally discarded. As a result, the price of these FPGAs could be set significantly low.

22 Claims, 4 Drawing Sheets

METHOD OF USING PARTIALLY DEFECTIVE PROGRAMMABLE LOGIC DEVICES

FIELD OF THE INVENTION

The present invention relates to programmable logic devices, and more particularly to a method for using programmable logic devices that contain minor defects.

BACKGROUND OF THE INVENTION

A programmable logic device, such as a field programmable gate array (FPGA), is designed to be user-programmable so that users can implement logic designs of their choices. In a typical architecture, an FPGA includes an array of configurable logic blocks (CLBs) surrounded by programmable input/output blocks (IOBs). The CLBs and IOBs are interconnected by a hierarchy of programmable routing resources. These CLBs, IOBs, and programmable routing resources are customized by loading a configuration bitstream into configuration memory cells of the FPGA. Additional resources, such as multipliers and memory, may be included.

There are strong customer demands for FPGAs that have a large number of CLBs, IOBs, and/or other resources (e.g., multipliers and block RAMs). This is because end products are becoming more complex, which require more CLBs and IOBs to implement complicated designs. As a result, the size of FPGA die and the resources fabricated on the die grow. This means that the chance of finding a defect in a die increases because the number of defects is proportional to the area of a die and the complexity of technology.

The circuits implemented by different customers of FPGAs are unique. Further, a circuit design may undergo modifications during product development phase. Thus, multiple versions of a circuit may be implemented on a FPGA. In other words, FPGAs are not design specific because they can be theoretically used in any design. This situation places a heavy burden on the quality and reliability of the FPGAs. If a FPGA contains a single defect (e.g., one of its configuration memory cells is defective), it may render an end product unusable because the design may need to use that defective resource. In order to avoid problems with customers, a FPGA manufacturer needs to discard a FPGA even if it contains only one defect.

The problem of low yield has significant economic impact on FPGA manufacturers. There are two types of defects: gross defect (that causes failure of an entire FPGA) and localized defect (that causes failure of small circuitry in the FPGA). It has been found that close to two thirds of large FPGA dies are discarded because of localized defects. If a method can be found to use some of these defective dies, the cost of product of the FPGA manufacturer could be reduced significantly. As a result, customers can take advantage of lower priced FPGAs for specific design patterns.

SUMMERY OF THE INVENTION

The present invention is a method for using a FPGA that contains at least one localized defect. A design is loaded into the FPGA. The FPGA is tested to determine whether it can execute the design accurately even with the localized defect. For example, if the design does not use the localized defect, the localized defect would not affect the execution of the design. In this case, the FPGA is accepted as suitable for this design. Even if the FPGA is found to be unsuitable for a specific design pattern, it may still be suitable for other designs. Thus, in another embodiment of the present invention, additional loading and testing of designs are performed.

By using this method, a FPGA manufacturer can sell FPGAs that are normally discarded. As a result, the price of these FPGAs could be very low.

The present invention is useful for FPGA customers that have finalized their designs. At that time, the design is fixed, and the above mentioned method can be used to determine whether a FPGA with localized defects can be used to implement the design. This method is especially useful for FGPA customers that are considering whether to convert a finalized design from FPGA to an application specific integrated circuit (ASIC). The FPGAs selected in accordance with the present invention can be very price competitive with ASICs. Further, no conversion from one type of device (FPGA) to another type (ASIC) is needed. This means that the "customer specific" integrated circuits are timing and functionality equivalent to the integrated circuits used in product development phase. Thus, it opens another possibility to the customers.

The above summary of the present invention is not intended to describe each disclosed embodiment of the present invention. The figures and detailed description that follow provide additional example embodiments and aspects of the present invention.

DETAILED DESCRIPTION OF THE INVENTION

The present invention relates to programmable logic devices. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
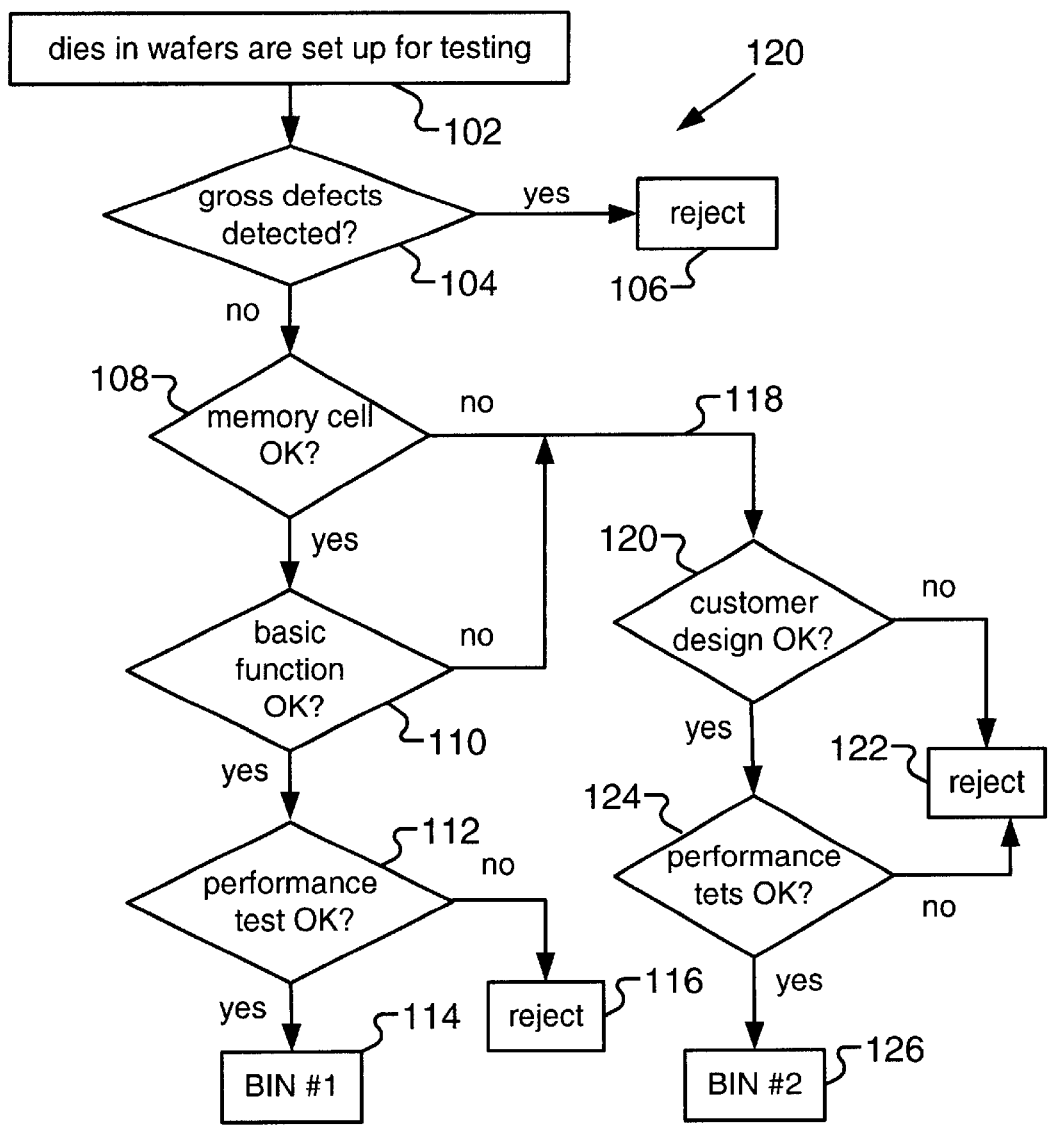
FIG. 1 is a flow chart showing the operation of the present invention.

FIG. 1 is a flow chart showing one embodiment of the present invention as applied to FPGAs. In step 102, fabricated dies in wafers are set up for testing. In step 104, gross defects are tested. This is typically a DC type of testing. Examples of gross defects are opens, shorts, and excessive leakage currents. If gross defects are found, the die is rejected (step 106). If there are no gross defects, test for localized defects follows. The memory cells are first tested (step 108). This test can be performed by writing digital data to the cells and reading them back. If there is no localized defect in the memory cells, the basic functions of the FPGA are tested (step 110). If there is no localized defect in the basic functions, performance testing is performed (step 112). An example of a performance test is speed performance testing. It is known that different integrated circuits from different fab lots or wafers may have different speed performance due to process variation. In order to make sure that a FPGA meets its manufacturer's speed performance specification, the FPGA can be configured to have different paths and then measure the time 'delay' of signal travel through each path. Usually, the FPGA that has less delay can handle circuits that need high speed performance. If the performance testing is passed, the FPGA is not defective, and is placed in a specially designated bin (step 114). If performance testing indicates that the FPGA does not meet the minimum performance specification, the FPGA is rejected (step 116).

The cases where the FPGA contains localized defects in memory cells (i.e., does not pass step 108) or basic functions (i.e., does not pass step 110) is now described. In prior art procedures, the FPGA is discarded. However, in the present invention, the FPGA is further tested to determine if it may be used to implement a specific customer design (step 120). In performing this step, the customer's design is loaded into the FPGA and the FPGA is configured. The FPGA is tested to make sure that the design works within specification. If the test reveals that the design is adversely affected by the localized defects in the FPGA, the FPGA is rejected (step 122). If the FPGA passes the test, a performance test is performed (step 124). If the FPGA fails to meet the minimum performance specification, it is again rejected. If it passes performance testing, the FPGA is placed in another specially designated bin (step 126). The FPGAs in this bin can only be used to implement this specific customer design.

The above described procedure works because many customer designs use a small portion (e.g., less than 10% to 15%) of the total FPGA available resources. For example, a FPGA contains many interconnect lines to allow users flexibility in designing their circuits. Many of these interconnect lines are not used in a specific design. Thus, if a FPGA contains only a few localized defects, it is likely that many designs do not encounter these localized defects. As a result, the FPGA is usable for that particular design. There is no need to discard the FPGA.

Figure 2:
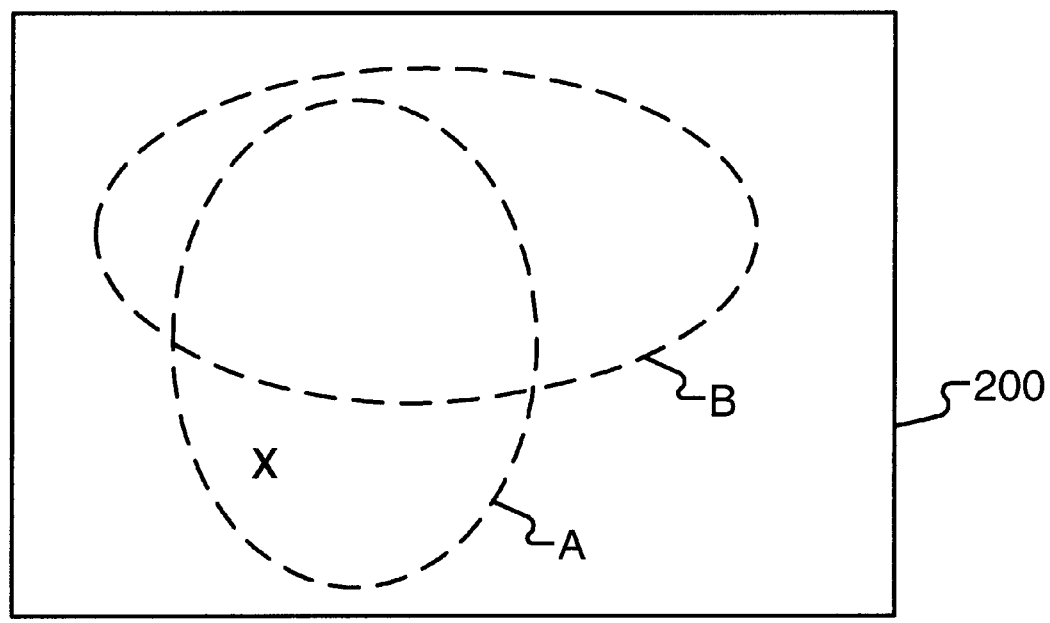
FIG. 2 is a schematic diagram showing an FPGA having a localized defect and the relationship of several designs to the localized defect.

As an improvement to the embodiment of FIG. 1, several customer designs can be tested. In case the FPGA is not useable for one design because this design encounters a localized defect, it is possible that the same FPGA may be used to implement another design. For example, FIG. 2 shows a FPGA 200 having one localized defect (shown as an "X" inside FPGA 200). Design A needs to use resources that include the localized defect, and thus FPGA 200 is not suitable to implement design A. However, design B does not involve this localized defect, and FPGA 200 may be used to implement design B. The same principle applies if FPGA 200 contains many localized defects.

Figure 3:
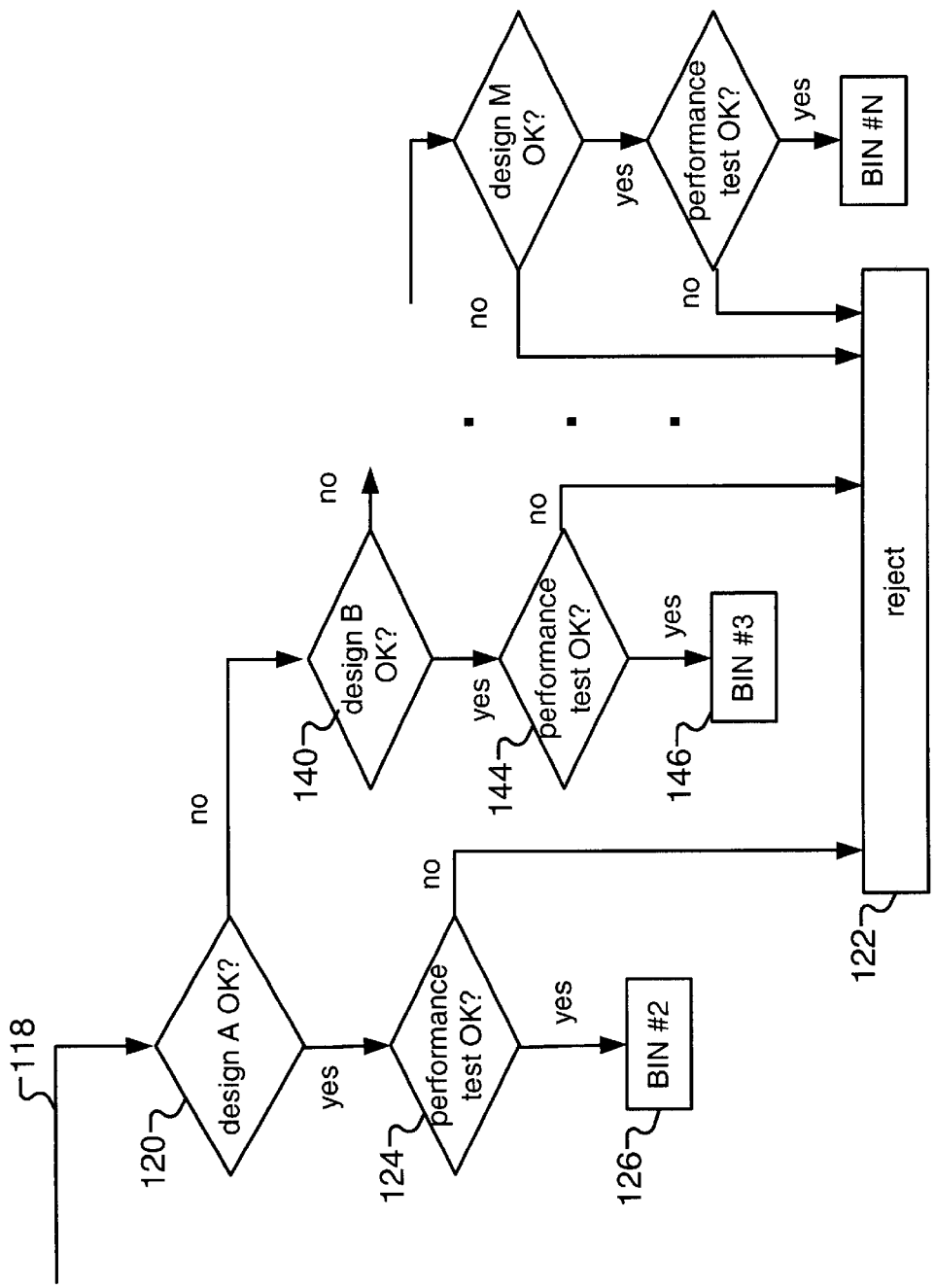
FIG. 3 is a flow chart showing another embodiment of the present invention.

FIG. 3 shows the testing performed after steps 108 and 110 indicates that the FPGA contains localized defects (shown in FIGS. 1 and 3 as line 118). Steps 120, 122, 124 and 126 in FIG. 3 are the same as the steps of the same reference numerals in FIG. 1. After the design in step 120 is found to be unsuitable for this FPGA, the FPGA is then tested for design B (step 140). If it is found that this FPGA is not suitable to implement design B, the next design is tested. If it is determined that this FPGA can be used to implement design B, a performance testing is performed (step 144). If the FPGA fails the performance testing, it is again rejected. If it passes the performance testing, the FPGA is placed in another specially designated bin (step 146). The FPGAs in this bin can only be used to implement this specific customer design.

The above described procedure is used until the last design (shown in FIG. 3 as design M) is tested.

Figure 4:
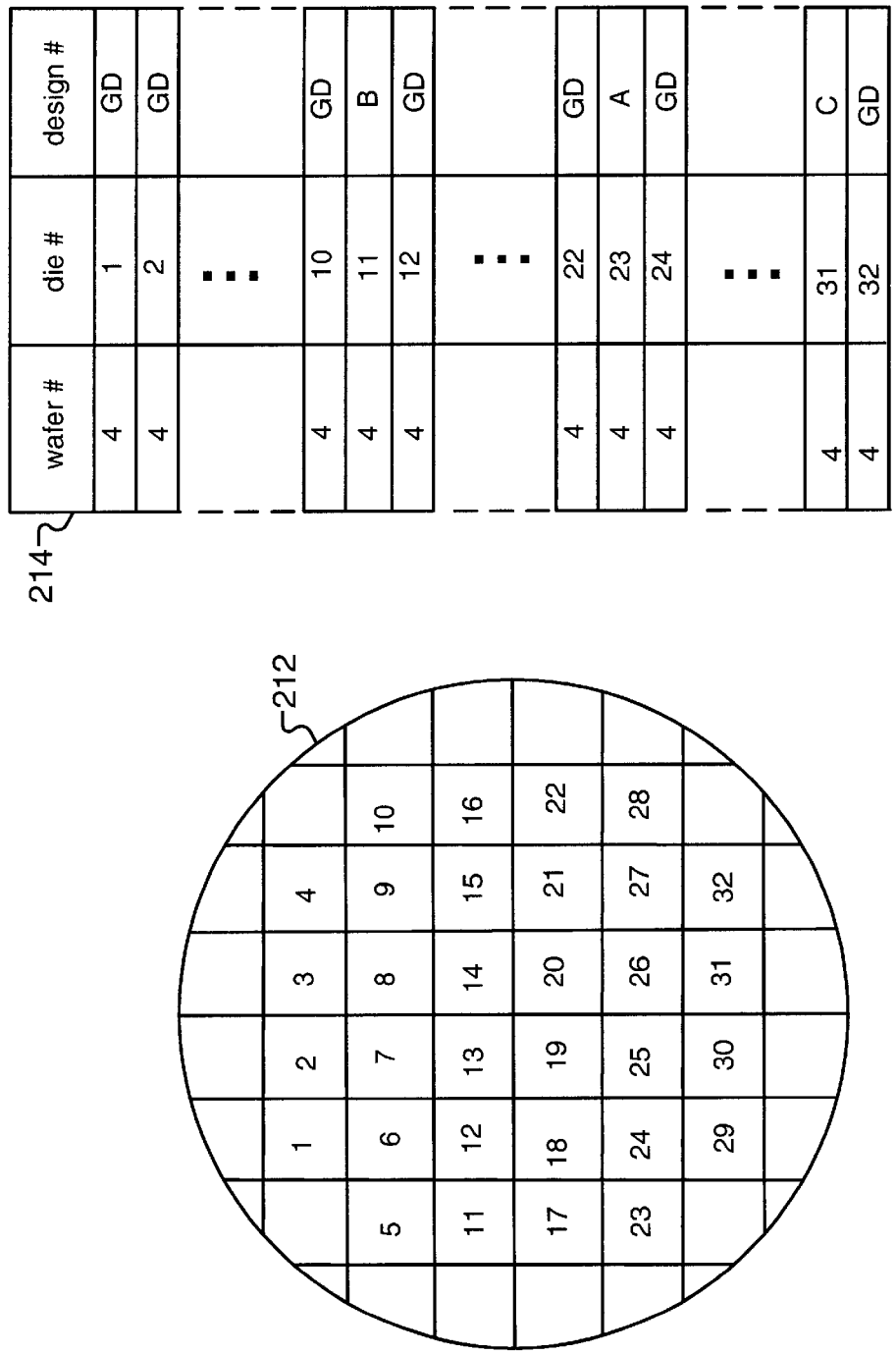
FIG. 4 is a schematic diagram showing die in a wafer and an associated file.

The application of the above described procedure in a wafer is now described. A wafer typically contains a number of dies (such as the dies marked "1", "2", . . . , "32", in a wafer 212 of FIG. 4). All, some, or none of the dies may contain localized defects. In one embodiment, each die is tested using the procedures described in FIG. 1 or 3. The result of the testing is stored in an electronic file 214. Each record in the file contains the identification of the corresponding die (i.e., wafer number in column 1 of file 214 and location of the die on the wafer in column 2 of file 214) and the design number assigned to this die. In FIG. 4, a non-defective die has a design number of "GD," (or other symbols) while dies having localized defects are associated with design numbers "A," "B," "C," etc. This file is used during assembly. In some cases, a customer wants to use different packages for different designs. In these cases, the file also associates a die with a package, depending on which customer design is associated with the die. One advantage of this method is that there is no need to apply ink to mark the die (as is done in some conventional system). After assembly, the finished package of a die may be marked with a special code to indicate that this FPGA is certified for a specific purpose. This code is visible to end users so as to avoid incorrectly using the FPGA. Prior to shipping the package, it may optionally go through additional testing to make sure that nothing is damaged during the assembly process.

It can be seen from the above description that a novel method to use defective FPGAs has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method for using a FPGA having at least one localized defect, comprising the steps of:

testing the FPGA for defects;

when the testing indicates a localized defect, loading a design of a plurality of designs into the FPGA;

testing the FPGA having the design to determine if it meets a predetermined specification; and accepting the FPGA having the localized defect, as suitable for the design if it meets the predetermined specification, wherein the localized defect is not repaired.

2. The method of claim 1, wherein the FPGA is rejected if the FPGA is tested for another design of the plurality of designs.

3. A method for accepting an Integrated Circuit (IC) comprising circuits having programmable functions and interconnections, the method comprising:

when first testing the IC indicates a localized defect, second testing the IC with a first user design of a plurality of user designs, wherein if third testing of the IC with a second user design of the plurality of user designs was performed, the IC would fail the third testing;

when the second testing passes, accepting the IC as suitable for use with the first user design.

4. The method of claim 3 wherein when the second testing passes, the IC is not suitable for use with the second user design.

5. A method for using a FPGA having at least one localized defect, comprising the steps of:

loading a first design into the FPGA;

testing the FPGA to determine if it meets a predetermined specification associated with the first design;

if the FPGA meets the predetermined specification associated with the first design, accepting the FPGA as suitable for the first designs;

if the FPGA does not meet the predetermined specification associated with the first design, performing the following steps:

loading a second design into the FPGA;

testing the FPGA to determine if it meets a predetermined specification associated with the second design;

if the FPGA meets the predetermined specification associated with the second design, accepting the FPGA as suitable for the second design, and as not suitable for the first design.

6. The method of claim 5 further comprising the steps of:

testing the FPGA for performance; and rejecting the FPGA if it fails minimum performance specification.

7. The method of claim 5 wherein the FPGA is one of a plurality of dies on a wafer, the method further comprising a step of providing an electronic file associating the FPGA with one of the first and second designs.

8. The method of claim 5 wherein the FPGA contains a package, the method further comprising a step of marking the package with a special code associating the FPGA with one of the first and the second designs.

9. A method for accepting a plurality of dies on a wafer for a plurality of customer designs, comprising:

means for determining a localized defect on a die of the plurality of dies;

means for testing the die with a customer design of the plurality of customer designs; and when the die passes the testing with the customer design, means for recording a first indication identifying the die on the wafer and a second indication of which customer design test passed.

10. A method for accepting an Integrated Circuit (IC) comprising circuits having programmable functions and interconnections, the IC further comprising a defect, wherein the IC has no redundant circuitry to repair the defect:

testing the IC with a design, the design for use by a customer; and if the IC passes the testing, accepting the IC having the defect for use with the design.

11. The method of claim 10 further comprising:

if the IC fails the testing, performing another test using another design;

if the IC passes the another test, accepting the IC having the defect for use with the another design, but not for use with the design.

12. A method of configuring a programmable logic device comprising:

testing the programmable logic device for proper implementation of a first design;

if the logic device fails to properly implement the first design, testing the programmable logic device for proper implementation of a second design; and if the programmable logic device fails to properly implement the first design and succeeds at properly implementing the second design, configuring the programmable logic device to implement the second design.

13. A programmable logic device comprising:

programmable elements, wherein some of the programmable elements perform properly; and at least one of the programmable elements has a defect; and a configuration memory configured to store a first configuration having programmable elements that perform properly and not having the at least one of the programmable elements that has the defect, wherein when the configuration memory is configured to store a second configuration, the second configuration has programmable elements that perform properly and has the at least one of the programmable elements that has the defect.

14. A method for providing an integrated circuit (IC) having programmable functions and routing resources, to a customer, comprising the steps of:

a. testing the IC for gross defects;

b. if a gross defect is not detected, testing memory cells associated with the programmable functions and routing resources;

c. if a memory cell has a localized defect, testing the IC using a specific customer design;

d. if the IC fails the testing in step c, rejecting the IC as not suitable to implement the specific customer design;

e. if the IC passes the testing in step c, testing the IC for performance; and f. if the IC passes the testing in step e, supplying the IC to the customer as suitable to implement only the customer design.

15. The method of claim 14 wherein the testing the IC for gross defects comprises testing for at least one of opens, shorts, or excessive leakage currents.

16. The method of claim 14 wherein the testing ells comprises writing data to the memory cells and subsequently, reading back the data from the memory cells.

17. The method of claim 14 wherein the testing the IC for performance comprises testin#for speed.

18. A method for providing an integrated circuit (IC) having programmable functions and routing resources, comprising the steps of:

testing the IC for defects;

when an IC has a defect, testing the IC using a specific design; and if the IC having the defect, passes the testing using the specific design, designating the IC as acceptable for implementing the specific design.

19. The method of claim 18 further comprising:

if the IC having the defect, fails the testing using the specific design, testing the IC using a another specific design;

if the IC having the defect, passes the testing using the another specific design, designating the IC as acceptable for implementing the another specific design.

20. The method of claim 19 wherein the designating the IC as acceptable for implementing the specific design, comprises a first bin indication and the designating the IC as acceptable for implementing the another specific design comprises a second bin indication.

21. The method of claim 18 wherein the designating the IC as acceptable for implementing the specific design includes designating the IC as acceptable for implementing only the specific design and no other design.

22. The method of claim 19 further comprising, shipping the designated IC to the customer.

* * * * *